US009425228B2

(12) United States Patent
Ting et al.

(10) Patent No.: US 9,425,228 B2
(45) Date of Patent: Aug. 23, 2016

(54) IMAGE SENSOR WITH REDUCED OPTICAL PATH

(71) Applicant: Taiwan Semiconductor Manufacturing Company Limited, Hsin-Chu (TW)

(72) Inventors: Shyh-Fann Ting, Tainan (TW); Ching-Chun Wang, Tainan (TW); Wei Chuang Wu, Tainan (TW); Yu-Jen Wang, Kaohsiung (TW); Chun-Ming Su, Kaohsiung (TW); Jhy-Jyi Sze, Hsin-Chu (TW); Chen-Jong Wang, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/100,598

(22) Filed: Dec. 9, 2013

(65) Prior Publication Data
US 2015/0155322 A1  Jun. 4, 2015

Related U.S. Application Data

(60) Provisional application No. 61/910,165, filed on Nov. 29, 2013.

(51) Int. Cl.
*H01L 27/146* (2006.01)

(52) U.S. Cl.
CPC ... *H01L 27/14625* (2013.01); *H01L 27/14629* (2013.01); *H01L 27/14643* (2013.01); *H01L 27/14685* (2013.01)

(58) Field of Classification Search
CPC .................. H01L 27/14625; H01L 27/14629; H01L 27/14643; H01L 27/14685
USPC ...................... 257/443, 432, E31.054; 438/7
See application file for complete search history.

(56) References Cited

U.S. PATENT DOCUMENTS

| 2006/0163451 A1* | 7/2006 | Park et al. .................. 250/208.1 |
| 2006/0275944 A1* | 12/2006 | Hyun .............................. 438/70 |
| 2009/0200622 A1* | 8/2009 | Tai et al. ....................... 257/432 |

* cited by examiner

*Primary Examiner* — Matthew Gordon
(74) *Attorney, Agent, or Firm* — Cooper Legal Group, LLC

(57) ABSTRACT

Among other things, one or more image sensors and techniques for forming image sensors are provided. An image sensor comprises a photodiode array configured to detect light. The image sensor comprises an oxide grid comprising a first oxide grid portion and a second oxide grid portion. A metal grid is formed between the first oxide grid portion and the second oxide grid portion. The oxide grid and the metal grid define a filler grid. The filler grid comprises a filler grid portion, such as a color filter, that allows light to propagate through the filler gird portion to an underlying photodiode. The oxide grid and the metal grid confine or channel the light within the filler gird portion. The oxide grid and the metal grid are formed such that the filler grid provides a relatively shorter propagation path for the light, which improves light detection performance of the image sensor.

20 Claims, 15 Drawing Sheets

IMAGE SENSOR WITH REDUCED OPTICAL PATH

BACKGROUND

An image sensor is a type of semiconductor device that converts an optical input into an electrical signal. The image sensor comprises an array of light detecting elements, such as photodiodes, where a light detecting element is configured to produce an electrical signal corresponding to an intensity of light impinging on the light detecting element. The electrical signal is used, in some instances, to display an image corresponding to the optical input.

DETAILED DESCRIPTION

Figure 1:
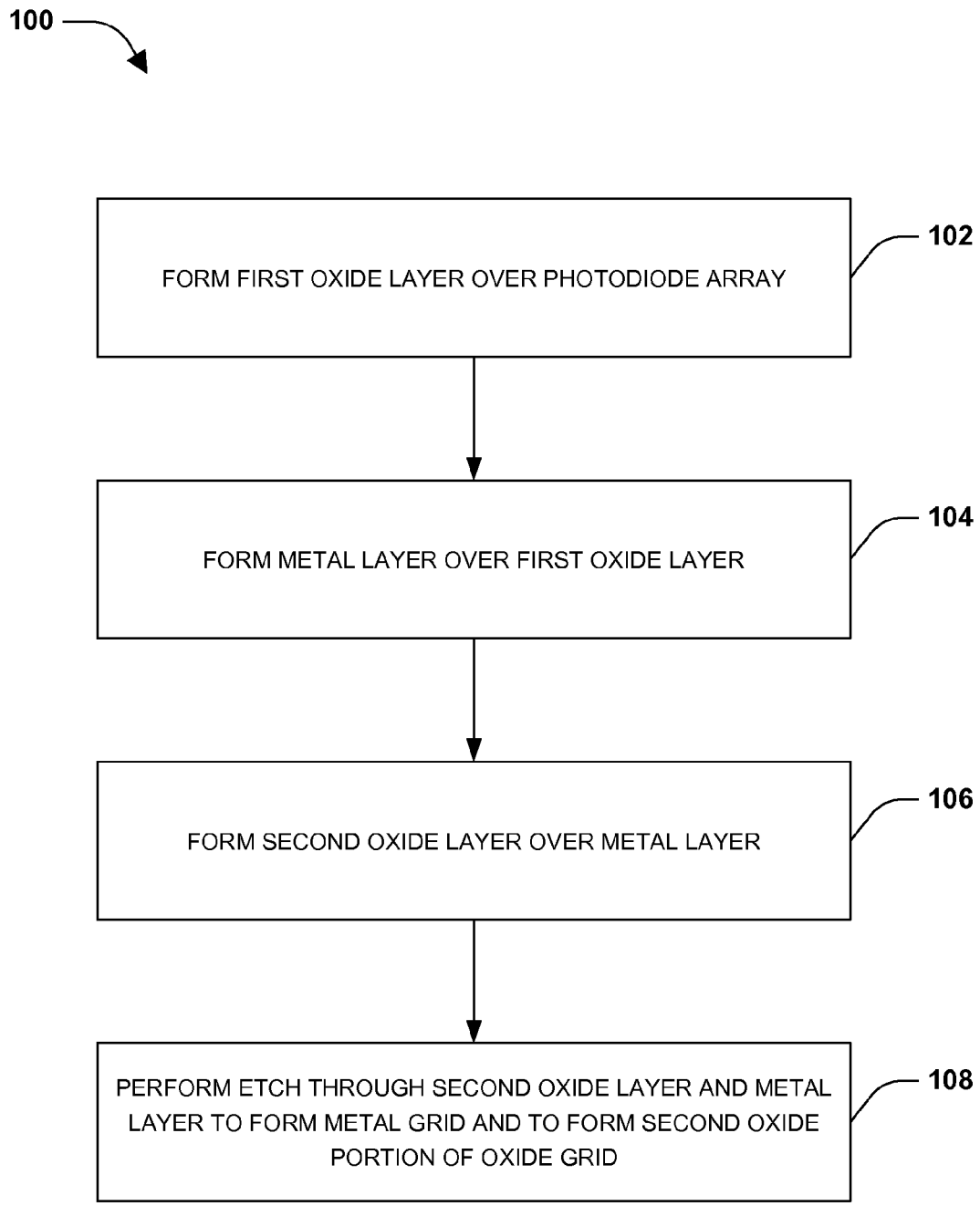
FIG. 1 is a flow diagram illustrating a method of forming an image sensor, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more image sensors and techniques for forming such image sensors are provided herein. According to some embodiments, an image sensor comprises a photodiode array formed over or within a substrate. The photodiode array comprises one or more photodiodes, such as image sensor pixels, configured to accumulate energy generated by light, such as from photons, of an optical input. A voltage of a photodiode is read as an output for the optical image. In some embodiments, a photodiode is situated under one or more layers or components formed over the substrate. Because light travels along a light propagation path that comprises such layers or components before reaching the photodiode, signal strength of the light can decay before reaching the photodiode or the light can travel towards another photodiode that is not to detect the light. Accordingly, as provided herein, an oxide grid portion and a metal grid portion, defining a filler grid that channels light towards photodiodes, are formed such that a light propagation path is reduced. Reducing the light propagation path improves performance of the image sensor, such as improving a signal to noise ratio for the image sensor or improving color detection by the image sensor. The light propagation path is reduced because the filler grid is defined as being substantially between a top surface of a first oxide grid portion of the oxide grid and a top surface of a second oxide grid portion of the oxide grid.

Figure 2:
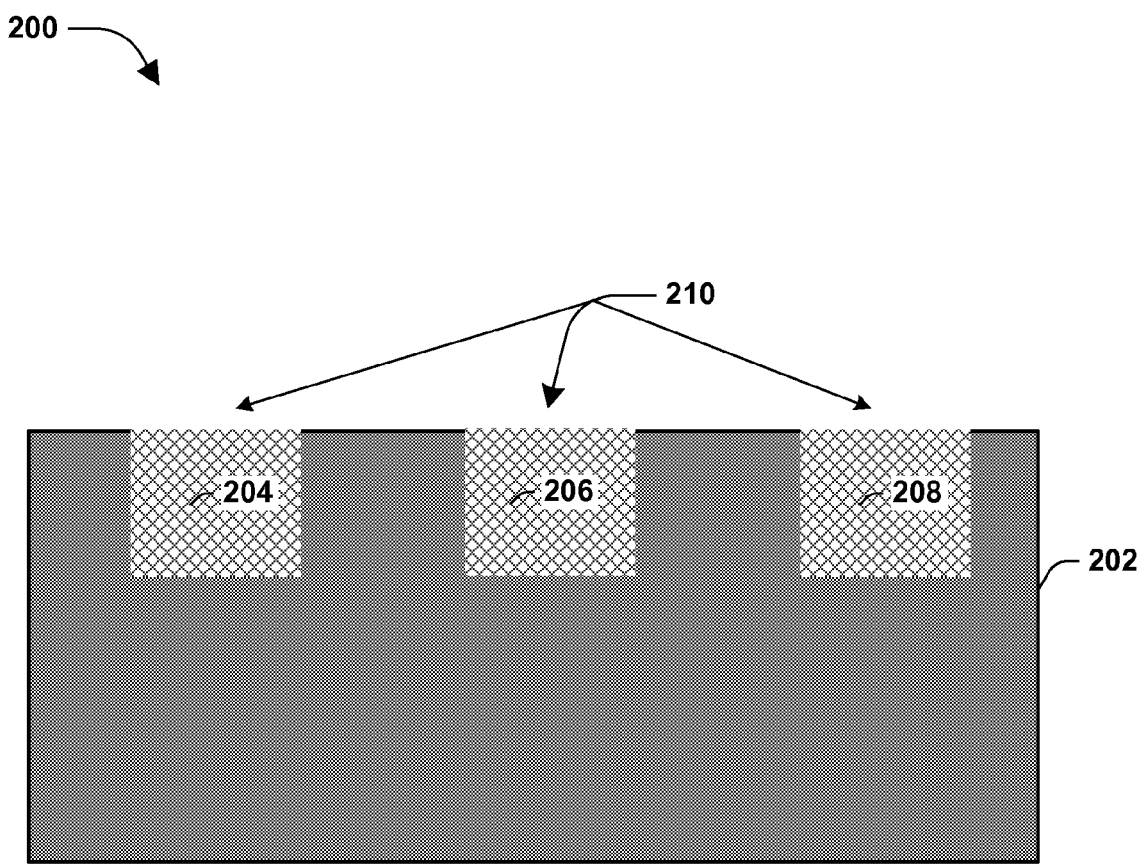
FIG. 2 is an illustration of a photodiode array of an image sensor, according to some embodiments.
Figure 3:
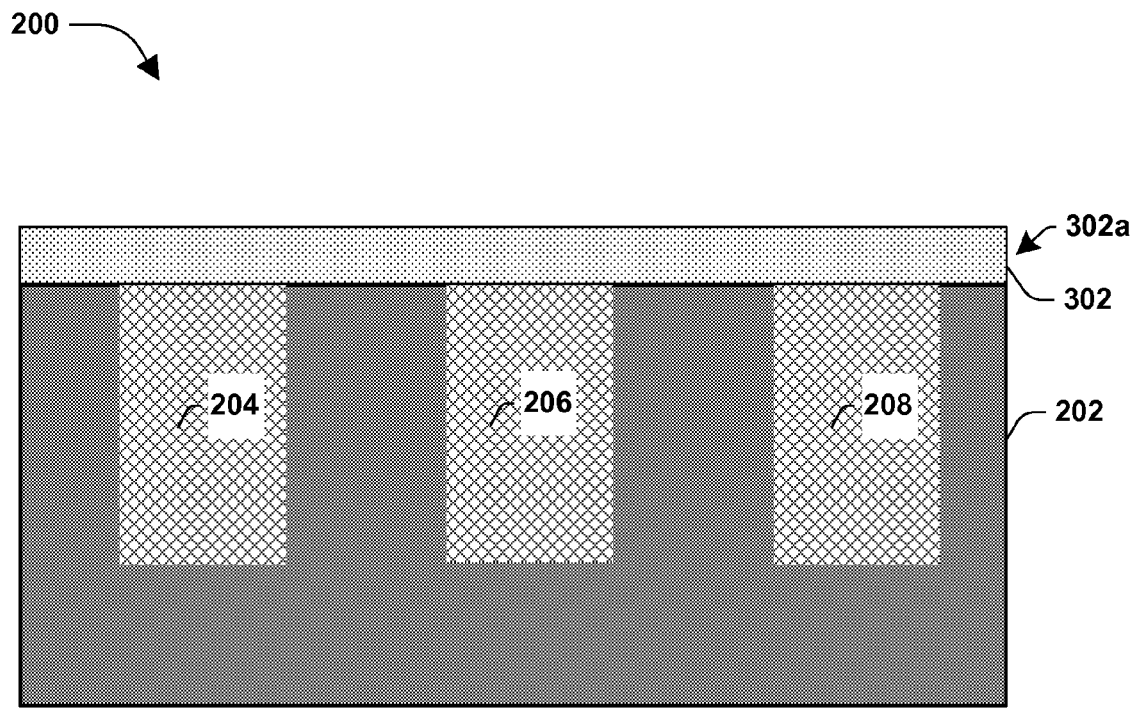
FIG. 3 is an illustration of a first oxide layer of an image sensor, according to some embodiments.

A method 100 of forming an image sensor, according to some embodiments, is illustrated in FIG. 1, and one or more image sensors formed by such a methodology are illustrated in FIGS. 2-8. An image sensor 200 comprises a photodiode array 210 formed within a substrate 202, as illustrated in FIG. 2. In some embodiments, the photodiode array 210 comprises a first photodiode 204, a second photodiode 206, a third photodiode 208, or other photodiodes configured to detected light. At 102, a first oxide layer 302 is formed over the photodiode array 210 as a first oxide gird portion 302a of an oxide grid, as illustrated in FIG. 3. In some embodiments, the first oxide layer 302 has a height between about 500 A to about 3000 A. In some embodiments, the first oxide layer 302 is formed by a deposition process.

Figure 4:
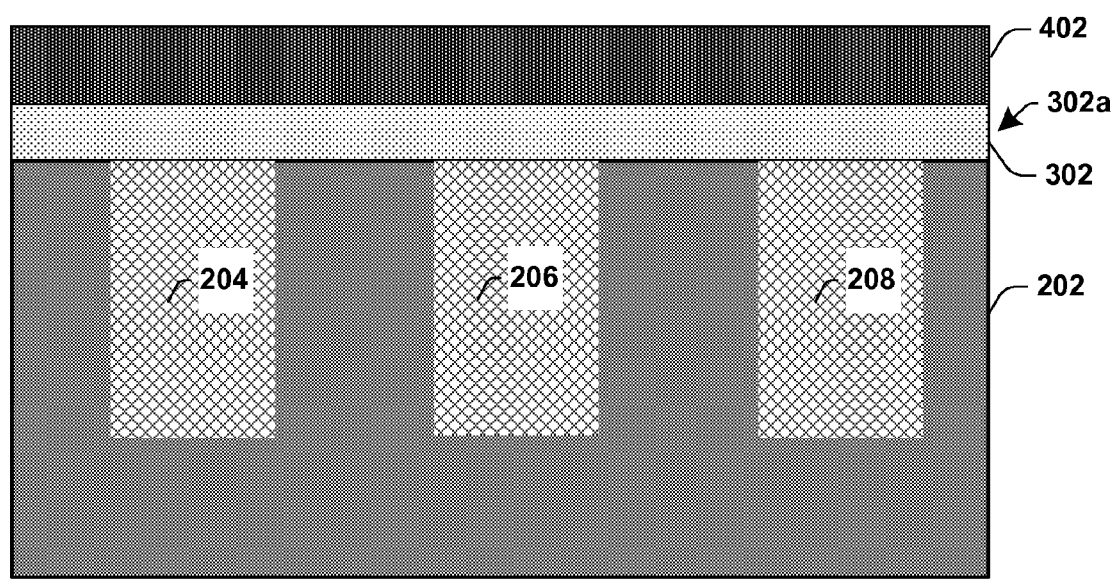
FIG. 4 is an illustration of a metal layer of an image sensor, according to some embodiments.

At 104, a metal layer 402 is formed over the first oxide layer 302, as illustrated in FIG. 4. In some embodiments, the metal layer 402 has a height between about 1000 A and about 3000 A. In some embodiments, the metal layer 402 has a width between about 0.1 microns and about 0.2 microns. In some embodiments, the metal layer 402 is formed by a film deposition process.

Figure 5:
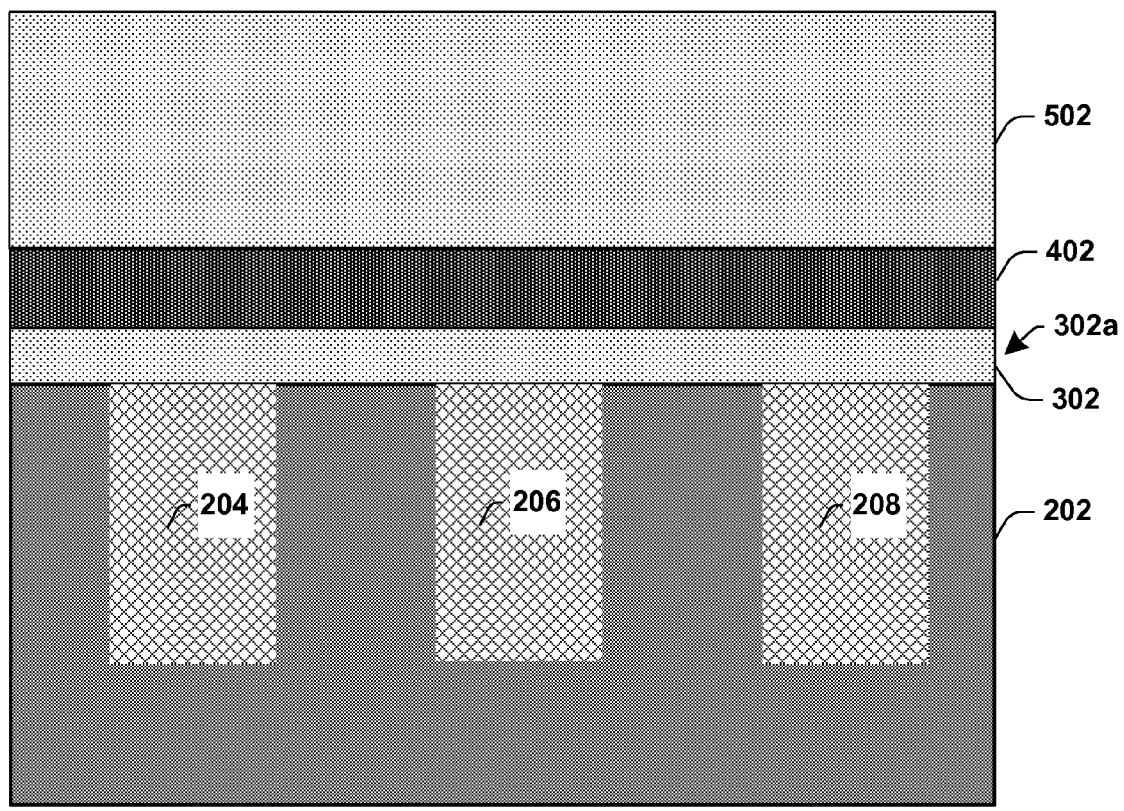
FIG. 5 is an illustration of a second oxide layer of an image sensor, according to some embodiments.

At 106, a second oxide layer 502 is formed over the metal layer 402, as illustrated in FIG. 5. In some embodiments, the second oxide layer 502 has a height between about 200 A to about 5000 A. In some embodiments, the second oxide layer 502 is formed by a deposition process. In some embodiments, a chemical mechanical polishing (CMP) process is performed after deposition of the second oxide layer 502.

Figure 6:
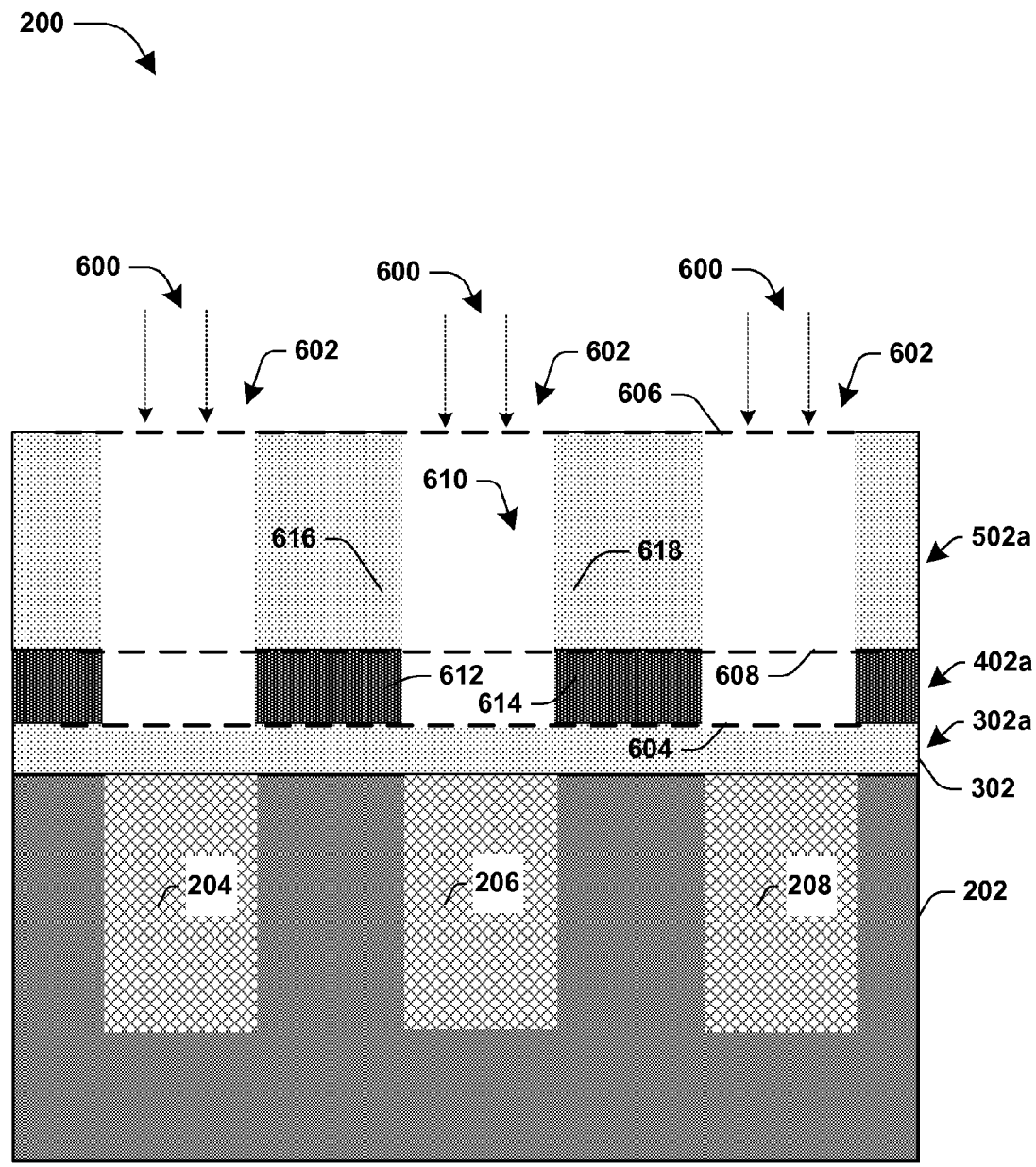
FIG. 6 is an illustration of defining an oxide grid and a metal grid of an image sensor, according to some embodiments.

At 108, an etch 600 is performed through the second oxide layer 502 and through the metal layer 402 to form a metal grid 402a and to form a second oxide gird portion 502a of the oxide grid, as illustrated in FIG. 6. The second oxide gird portion 502a is formed over the metal grid 402a. The second oxide gird portion 502a and the metal grid 402a define a filler grid 602 within which a fill material, such as a color filter material that guides light towards the photodiode array 210, could be formed. The filler grid is formed substantially between a top surface 604 of the first oxide grid portion 302a and a top surface 606 of the second oxide grid portion 502a. In some embodiments, a bottom surface of the filler grid 602 is formed below the second oxide grid portion 502a. In some embodiments, the bottom surface of the filler grid 602 is formed below a top surface 608 of the metal grid 402a.

In some embodiments, the filler grid 602 comprises a first filler grid portion 610 formed between a first metal grid structure 612 of the metal grid 402a and a second metal gird structure 614 of the metal grid 402a. In some embodiments, the first filler grid portion 610 is formed between a first oxide grid structure 616 of the second oxide grid portion 502a and a second oxide grid structure 618 of the second oxide grid portion 502a. In some embodiments, the first filler grid portion 610 is confined on a first side by the first oxide grid structure 616 and the first metal grid structure 612. The first filler gird portion 610 is confined on a second side by the second oxide grid structure 618 and the second metal grid structure 614. The first filler grid structure 610 is confined on a bottom side by the first oxide gird portion 302a.

Figure 7:
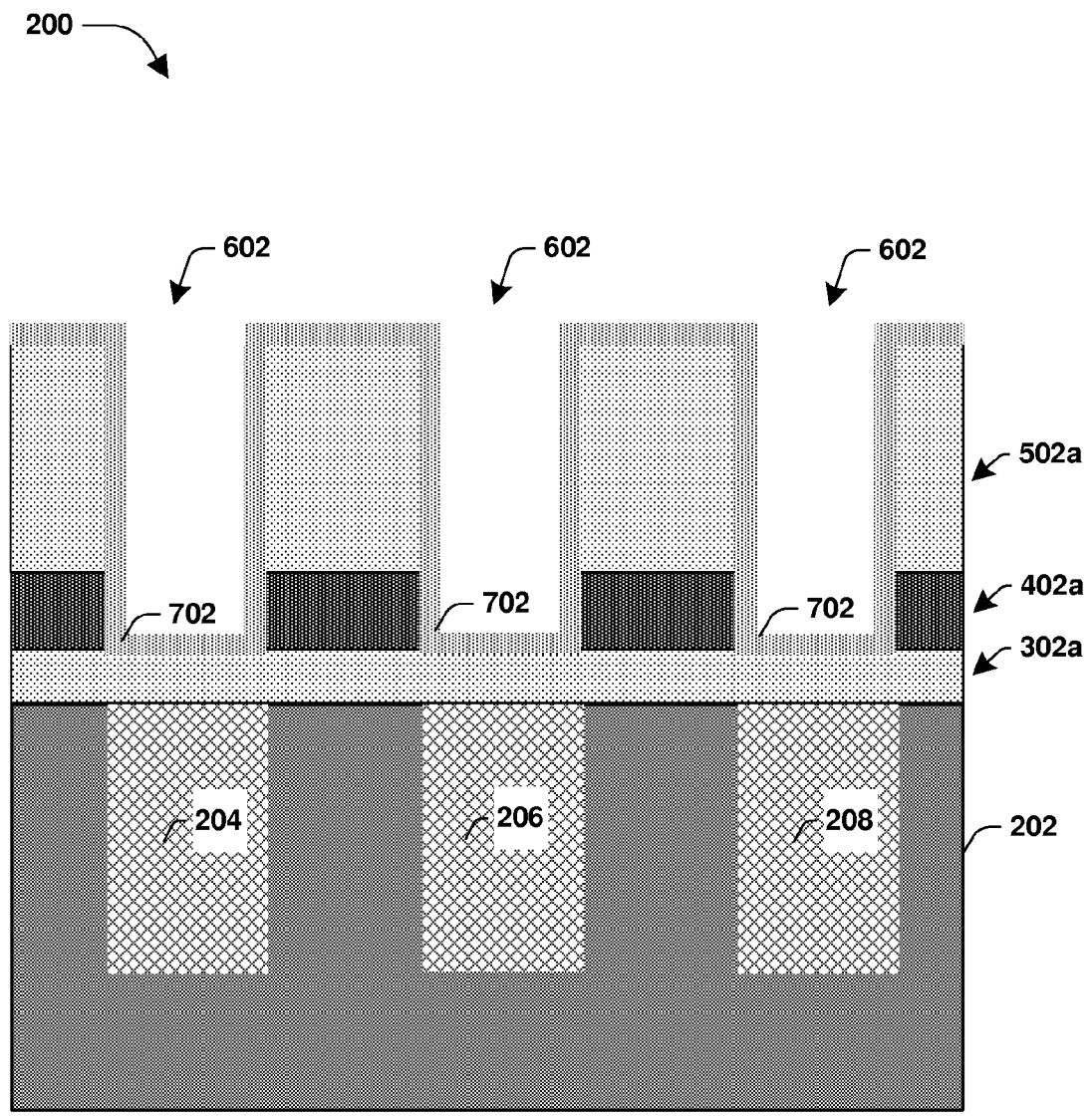
FIG. 7 is an illustration of a capping layer of an image sensor, according to some embodiments.

In some embodiments, a capping layer 702 is formed to line the filler grid 602, as illustrated in FIG. 7. In some embodiments, the capping layer 702 comprises a material, such as an oxide film, used to protect the metal grid 402a, such as from moisture issues resulting from a fill material used to fill the filler grid 602. In some embodiments, the capping layer 702 is formed using a conformal oxide deposition process. In some embodiments, the capping layer 702 has a thickness between about 200 A to about 1500 A. In some embodiments, the capping layer 702 is formed between the filler grid 602 and the first oxide gird portion 302a. In some embodiments, the capping layer 702 is formed between the filler grid 602 and the metal grid 402a. In some embodiments, the capping layer 702 is formed between the filler grid 602 and the second oxide grid portion 502a.

Figure 8:
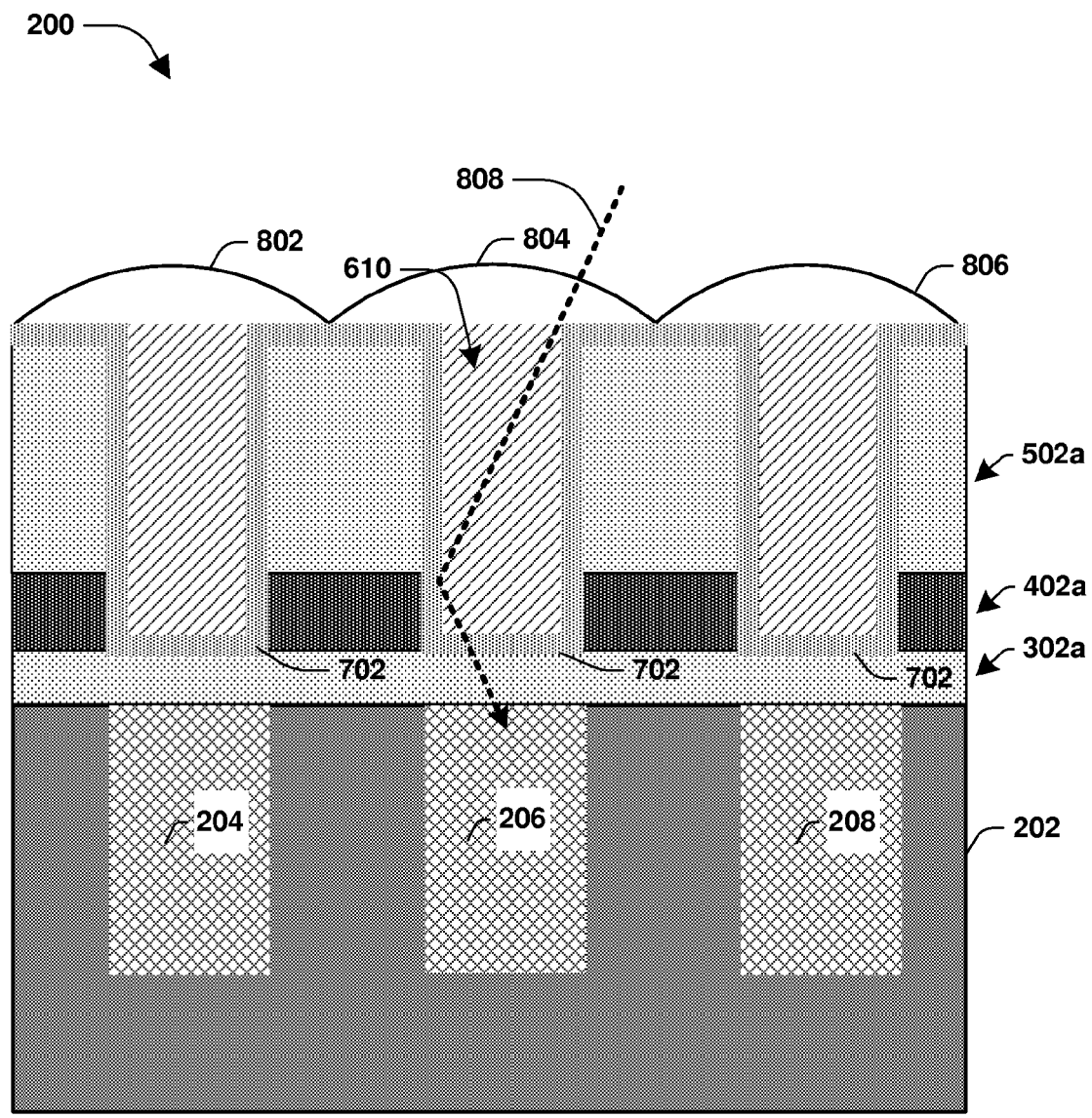
FIG. 8 is an illustration of an image sensor detecting light, according to some embodiments.

FIG. 8 illustrates the second photodiode 206 of the image sensor 200 detecting light 808. The image sensor 200 comprises one or more lens structures, such as a first lens structure 802, a second lens structure 804, and a second lens structure 806. In some embodiments, light 808, incident to the second lens structure 804, is focused towards the first filler grid structure 610 comprises a color filter material. The color filter material of the first filler grid structure 610 allows at least some of the light 808 to propagate towards the second photodiode 206. At least one of the first oxide grid portion 302a of the oxide grid, the second oxide grid portion 502a of the oxide grid, or the metal grid 402a confines the light 808 so that the light is detected by the photodiode 206 as opposed to being detected by a different photodiode that is not to detect the light 808. Because the first filler grid structure 610 is confined by the oxide grid and the metal grid 402a, such as being formed between the top surface 606 of the second oxide grid portion 502a and the top surface 604 of the first oxide grid portion 302a as illustrated in FIG. 6, a light propagation path for the light 808 is reduced. Reducing the light propagation path improves performance of the image sensor 200, such as improved detection of the light 808 by the second photodiode 206.

Figure 9:
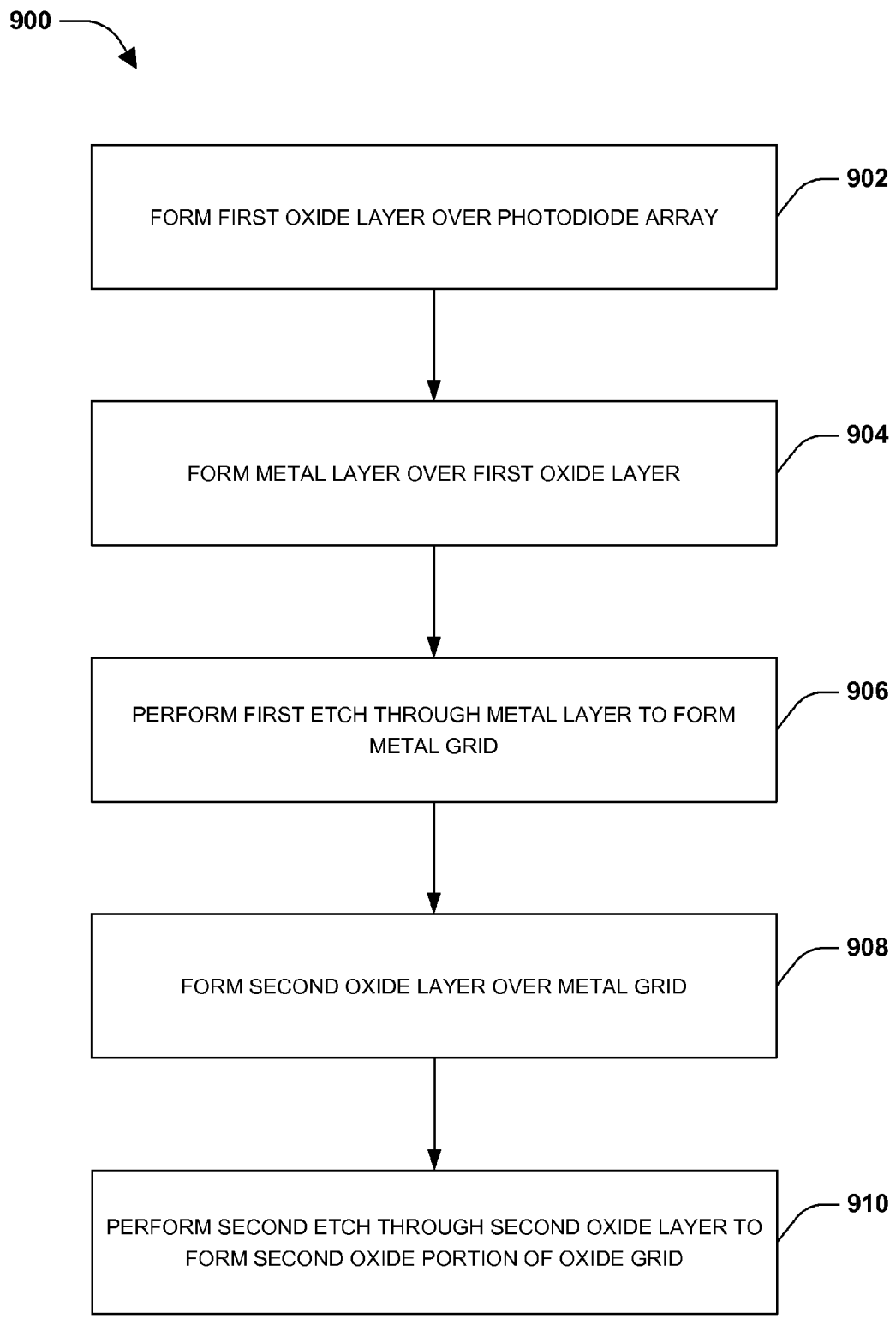
FIG. 9 is a flow diagram illustrating a method of forming an image sensor, according to some embodiments.
Figure 10:
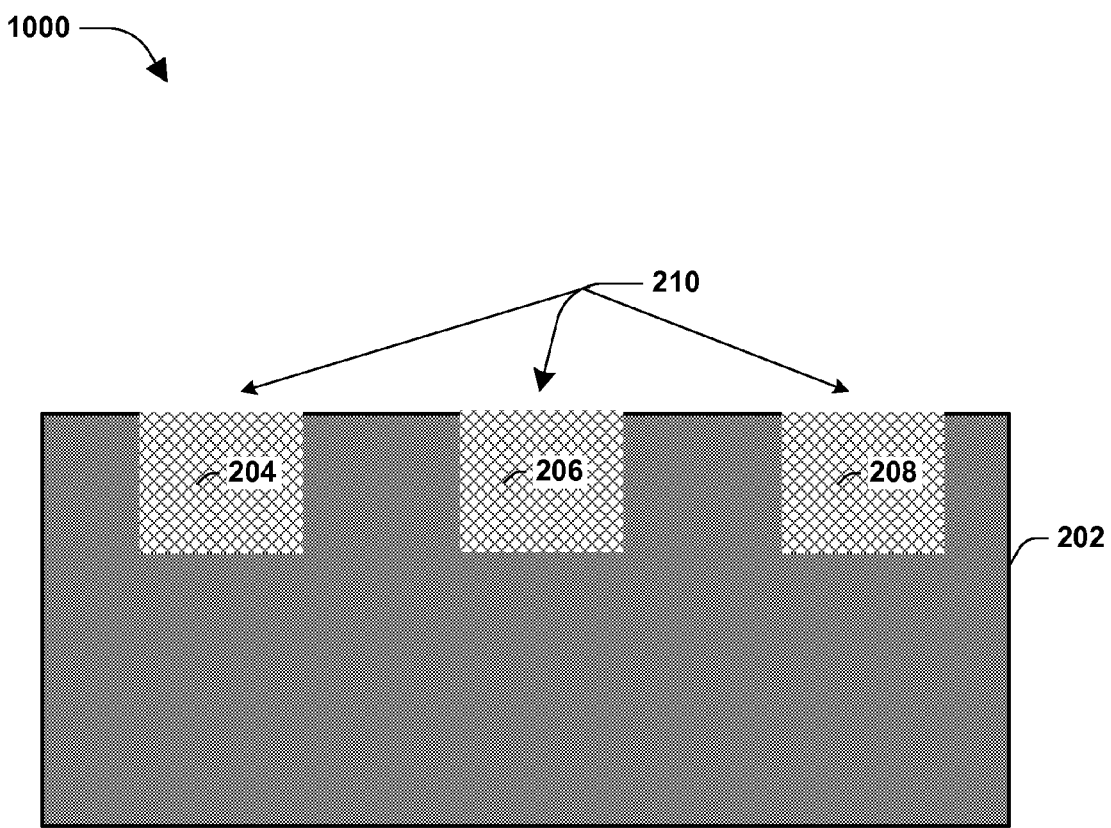
FIG. 10 is an illustration of a photodiode array of an image sensor, according to some embodiments.
Figure 11:
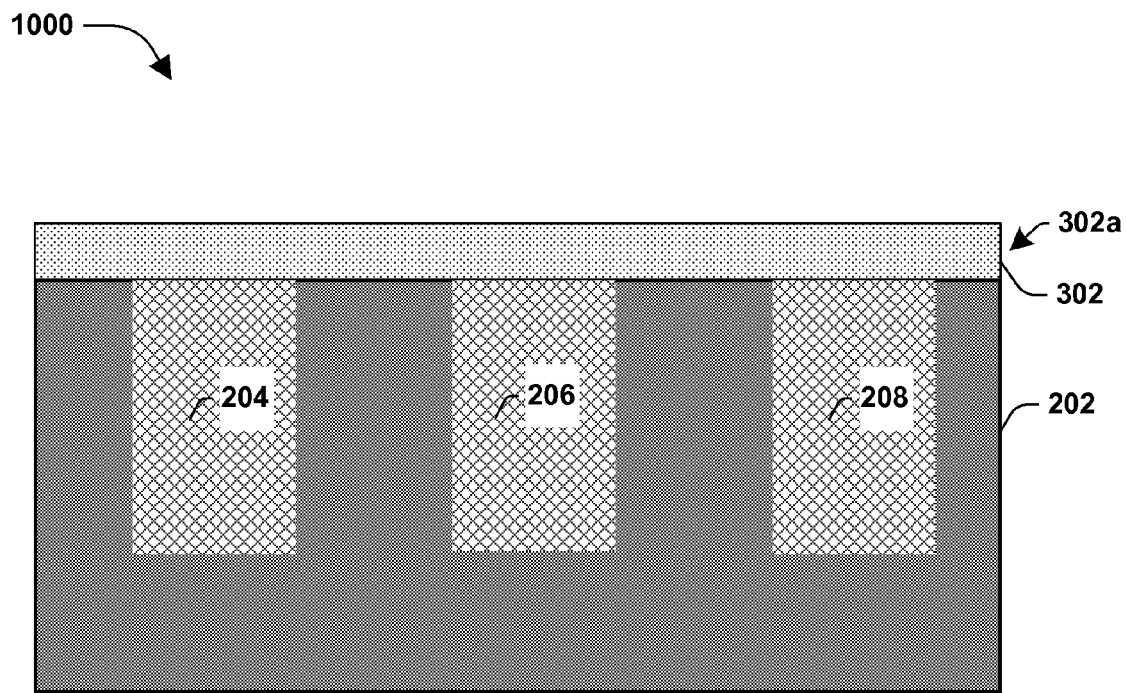
FIG. 11 is an illustration of a first oxide layer of an image sensor, according to some embodiments.
Figure 12:
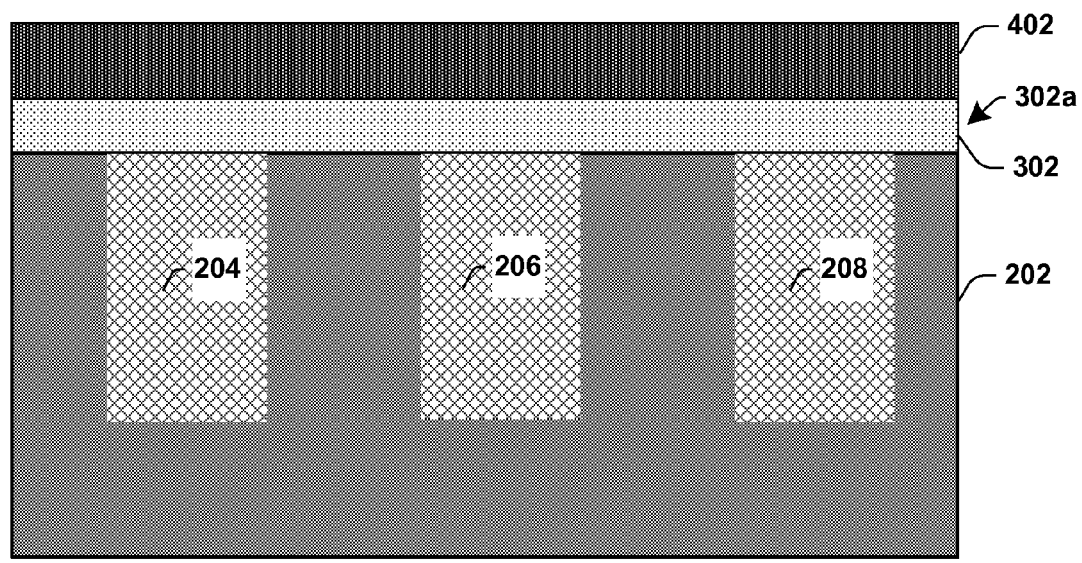
FIG. 12 is an illustration of a metal layer of an image sensor, according to some embodiments.
Figure 13:
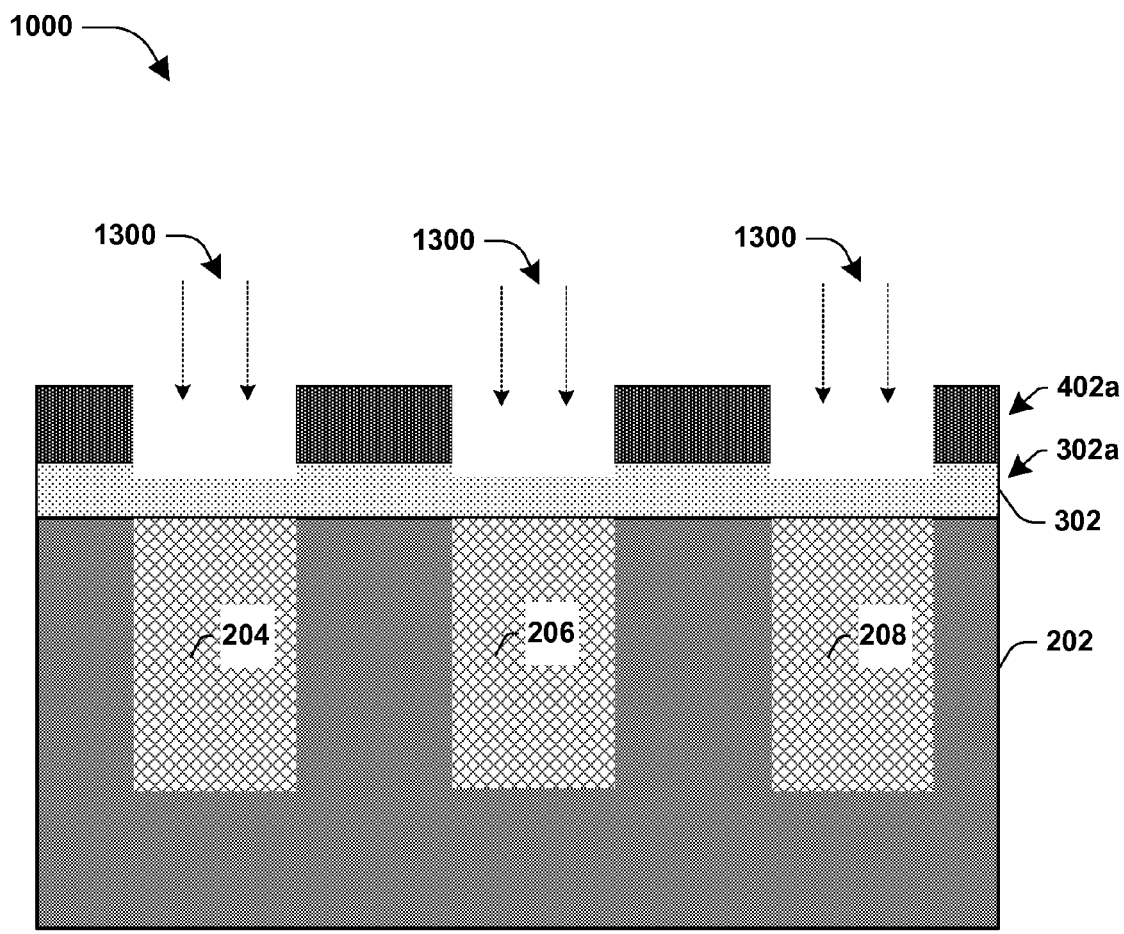
FIG. 13 is an illustration of defining a metal grid of an image sensor, according to some embodiments.

A method 900 of forming an image sensor, according to some embodiments, is illustrated in FIG. 9, and one or more image sensors formed by such a methodology are illustrated in FIGS. 10-15. An image sensor 1000 comprises the photodiode array 210, comprising the first photodiode 204, the second photodiode 206, and the third photodiode 208, formed within the substrate 202, as illustrated in FIG. 10. At 902, the first oxide layer 302 is formed over the photodiode array 210 as the first oxide gird portion 302a of the oxide grid, as illustrated in FIG. 11. At 904, the metal layer 402 is formed over the first oxide layer 302, as illustrated in FIG. 12. At 906, a first etch 1300 is performed through the metal layer 402 to form the metal grid 402a. In some embodiments of performing the first etch 1300, a hard mask is formed over the metal layer 402, such that a portion of the hard mark overlays a portion of the metal layer 402 to define the metal grid 402a during the first etch 1300.

Figure 14:
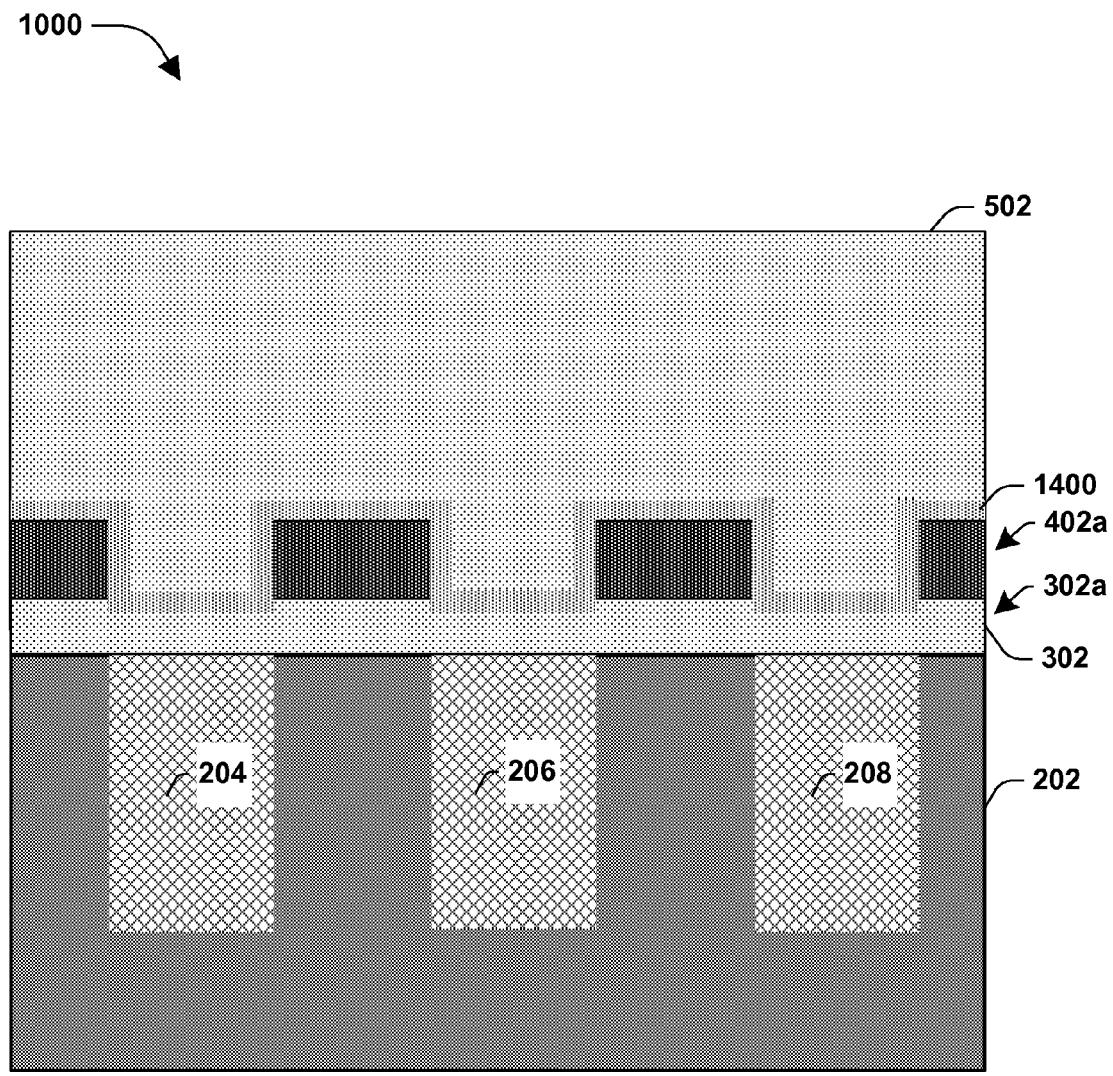
FIG. 14 is an illustration of a capping layer and a second oxide layer of an image sensor, according to some embodiments.
Figure 15:
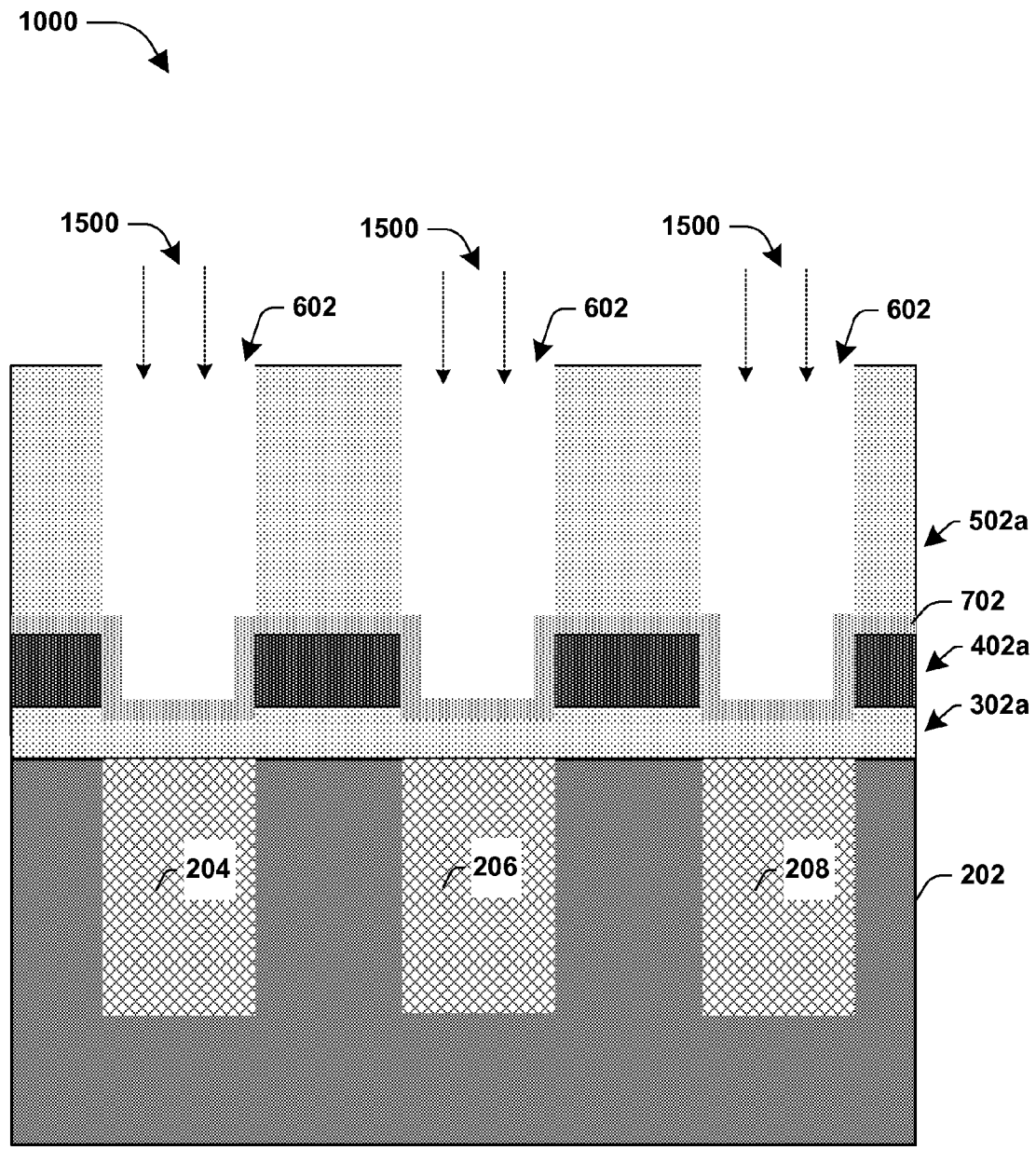
FIG. 15 is an illustration of defining an oxide grid of an image sensor, according to some embodiments.

In some embodiments, a capping layer 1400 is formed over the metal grid 402a, as illustrated in FIG. 14. In some embodiments, the capping layer 1400 has a thickness between about 100 A to about 2000 A. In some embodiments, the capping layer 1400 comprises a nitride material or an oxide material. At 908, a second oxide layer 502 is formed over the metal grid 402a, as illustrated in FIG. 14. In some embodiments, the second oxide layer 502 is formed over the capping layer 1400. In some embodiments, a CMP process is performed on the second oxide layer 502. At 910, a second etch 1500 is performed through the second oxide layer 502 to form the second oxide grid portion 502a of the oxide grid, as illustrated in FIG. 15. At least one of the oxide grid, such as the first oxide grid portion 302a and the second oxide grid portion 502a, or the metal grid 402a define the filler grid 602. In this way, the filler grid 602 is formed according to a multiple etch process.

According to an aspect of the instant disclosure, an image sensor is provided. The image sensor comprises a photodiode array formed over a substrate. The image sensor comprises a first oxide grid portion of an oxide grid. The first oxide grid portion is formed over the photodiode array. The image sensor comprises a metal grid that is formed over the first oxide grid portion. The image sensor comprises a second oxide grid portion that is formed over the metal grid. The image sensor comprises a filler grid that is formed substantially between a top surface of the first oxide grid portion and a top surface of the second oxide grid portion.

According to an aspect of the instant disclosure, a method for forming an image sensor is provided. The method comprises forming a first oxide layer over a photodiode array comprised within a substrate. The first oxide layer is formed as a first oxide grid portion of an oxide grid. A metal layer is formed over the first oxide layer. An etch is performed through the second oxide layer and the metal layer to form a metal grid and to form a second oxide grid portion of the oxide grid. The oxide grid and the metal grid define a filler grid formed substantially between a top surface of the first oxide grid portion and a top surface of the second oxide grid portion.

According to an aspect of the instant disclosure, a method for forming an image sensor is provided. The method comprises forming a first oxide layer over a photodiode array comprised within a substrate. The first oxide layer is formed as a first oxide grid portion of an oxide grid. A metal layer is formed over the first oxide layer. A first etch is performed through the metal layer to form a metal grid. A second oxide layer is formed over the metal grid. A second etch is performed through the second oxide layer to form a second oxide gird portion of the oxide grid. The oxide grid and the metal grid define a filler grid formed substantially between a top surface of the first oxide grid portion and a top surface of the second oxide grid portion.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein.

Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. An image sensor, comprising:
    a photodiode array overlapping a substrate;
    a first oxide layer overlapping the photodiode array;
    a metal grid comprising a first metal grid structure and a second metal grid structure in contact with a top surface of the first oxide layer;
    an oxide grid comprising a first oxide grid structure in contact with a top surface of the first metal grid structure and a second oxide grid structure in contact with a top surface of the second metal grid structure;
    a filler grid comprising a first filler grid structure overlapping the first oxide layer and between the first metal grid structure and the second metal grid structure; and
    a capping layer in contact with the top surface of the first oxide layer, wherein there is no metal between a top surface of the first oxide grid structure and a lens structure overlapping the first oxide grid structure.

2. The image sensor of claim 1, wherein the capping layer is in contact with a bottom surface of the first filler grid structure.

3. The image sensor of claim 1, wherein the first filler grid structure is between the first oxide grid structure and the second oxide grid structure.

4. The image sensor of claim 1, wherein the capping layer is in contact with the first filler grid structure.

5. The image sensor of claim 1, wherein the capping layer is in contact with the first metal grid structure and second metal grid structure.

6. The image sensor of claim 1, wherein the capping layer lines a sidewall of the first filler grid structure.

7. The image sensor of claim 1, wherein the lens structure in contact with a top surface of the capping layer.

8. The image sensor of claim 1, wherein the first oxide layer overlaps a first photodiode of the photodiode array, a second photodiode of the photodiode array, and a portion of the substrate between the first photodiode and the second photodiode.

9. The image sensor of claim 1, wherein the first filler grid structure comprises a color filter material configured to filter wavelengths within a defined range of wavelengths.

10. An image sensor, comprising:
    a photodiode array comprising a first photodiode and a second photodiode overlapping a substrate;
    a first oxide layer overlapping the first photodiode, the second photodiode, and a portion of the substrate between the first photodiode and the second photodiode;
    a filler grid comprising a first filler grid structure and a second filler grid structure overlapping the first oxide layer;
    a metal grid comprising a first metal grid structure between the first filler grid structure and the second filler grid structure, wherein the first metal grid structure is in contact with a top surface of the first oxide layer;
    an oxide grid comprising a first oxide grid structure between the first filler grid structure and the second filler grid structure, wherein the first oxide grid structure is in contact with a top surface of the first metal grid structure;
    a capping layer in contact with the top surface of the first oxide layer; and
    a lens structure overlapping the first oxide grid structure, wherein there is no metal between a top surface of the first oxide grid structure and the lens structure.

11. The image sensor of claim 10, wherein the lens structure is in contact with a top surface of the capping layer.

12. The image sensor of claim 10, wherein the first filler grid structure comprises a color filter material configured to filter wavelengths within a defined range of wavelengths.

13. The image sensor of claim 10, wherein the capping layer is in contact with the first oxide grid structure.

14. The image sensor of claim 10, wherein the capping layer is in contact with the first metal grid structure and the first filler grid structure.

15. The image sensor of claim 10, wherein the capping layer is between the first oxide grid structure and the first filler grid structure.

16. The image sensor of claim 10, wherein the capping layer is in contact with the first oxide grid structure and the first filler grid structure.

17. The image sensor of claim 10, wherein the capping layer is between the first oxide layer and the first filler grid structure.

18. The image sensor of claim 10, wherein the capping layer is in contact with a bottom surface of the first filler grid structure.

19. An image sensor, comprising:
- a photodiode array in contact with a substrate;
- a first oxide layer in contact with the photodiode array and overlapping the substrate;
- a metal grid comprising a first metal grid structure in contact with a top surface of the first oxide layer;
- an oxide grid comprising a first oxide grid structure in contact with a top surface of the first metal grid structure;
- a capping layer in contact with the top surface of the first oxide layer, the first metal grid structure, and the first oxide grid structure, wherein there is no metal between a top surface of the first oxide grid structure and a lens structure overlapping the first oxide grid structure; and
- a filler grid comprising a first filler grid structure in contact with the capping layer.

20. The image sensor of claim 19, wherein the lens structure is in contact with a top surface of the capping layer.

* * * * *